(12) United States Patent
Pulluru et al.

(10) Patent No.: US 10,665,295 B2
(45) Date of Patent: May 26, 2020

(54) STATIC RANDOM-ACCESS MEMORY WITH VIRTUAL BANKING ARCHITECTURE, AND SYSTEM AND METHOD INCLUDING THE SAME

(71) Applicant: SAMSUNG ELECTRONICS CO., LTD., Suwon-si, Gyeonggi-Do (KR)

(72) Inventors: Lava Kumar Pulluru, Karnataka (IN); Parvinder Kumar Rana, Karnataka (IN); Akash Kumar Gupta, Karnataka (IN); Gayatri Nair, Kerala (IN)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/191,717

(22) Filed: Nov. 15, 2018

(65) Prior Publication Data
US 2019/0147944 A1   May 16, 2019

(30) Foreign Application Priority Data

Nov. 15, 2017 (IN) .............................. 201741040880
Nov. 14, 2018 (IN) .............................. 201741040880

(51) Int. Cl.
| | |
|---|---|
| *G11C 11/419* | (2006.01) |
| *G11C 11/4097* | (2006.01) |
| *G11C 7/10* | (2006.01) |
| *G11C 7/12* | (2006.01) |
| *G11C 7/18* | (2006.01) |
| *G11C 8/12* | (2006.01) |
| *G11C 11/418* | (2006.01) |

(52) U.S. Cl.
CPC .......... *G11C 11/419* (2013.01); *G11C 7/1048* (2013.01); *G11C 7/12* (2013.01); *G11C 7/18* (2013.01); *G11C 8/12* (2013.01); *G11C 11/4097* (2013.01); *G11C 11/418* (2013.01); *G11C 2207/005* (2013.01)

(58) Field of Classification Search
CPC ....... G11C 11/419; G11C 7/1048; G11C 7/12; G11C 7/18; G11C 8/12; G11C 11/4097; G11C 11/418
USPC ....................................... 365/189.011–225.7
See application file for complete search history.

(56) References Cited

U.S. PATENT DOCUMENTS

| | | |
|---|---|---|
| 7,113,433 B2 | 9/2006 | Chan et al. |
| 8,971,133 B1 | 3/2015 | Zheng et al. |
| (Continued) | | |

*Primary Examiner* — Harry W Byrne
(74) *Attorney, Agent, or Firm* — F. Chau & Associates, LLC (57) ABSTRACT

A static random-access memory (SRAM) system using a virtual banking architecture includes a processor communicatively coupled to an SRAM, and a plurality of circuits disposed in the SRAM and operated under control of the processor. The circuits include a divide circuit, a select circuit disposed in the divide circuit, and a local input/output circuit. The divide circuit divides a bank into first and second bit cell arrays, in which the first bit cell array and/or the second bit cell array includes at least one bit line. The select circuit is connected between the first and second bit cell arrays, and the select circuit selects one of the first and second bit cell arrays according to a predefined select logic. The local input/output circuit is connected to the select circuit and generates an output according to one or more predefined operations of the local input/output circuit.

7 Claims, 7 Drawing Sheets

(56) References Cited

U.S. PATENT DOCUMENTS

| | | | |
|---|---|---|---|
| 2007/0121499 A1* | 5/2007 | Pal | H04L 45/60 |
| | | | 370/230 |
| 2009/0049220 A1* | 2/2009 | Conti | G06F 13/24 |
| | | | 710/267 |
| 2012/0026818 A1 | 2/2012 | Chen et al. | |
| 2013/0159602 A1* | 6/2013 | Adams | G06F 12/02 |
| | | | 711/103 |
| 2017/0148506 A1 | 5/2017 | Kwack et al. | |
| 2017/0228192 A1 | 8/2017 | Willcock et al. | |

\* cited by examiner

STATIC RANDOM-ACCESS MEMORY WITH VIRTUAL BANKING ARCHITECTURE, AND SYSTEM AND METHOD INCLUDING THE SAME

CROSS-REFERENCE TO RELATED APPLICATIONS

This application claims priority under 35 U.S.C. § 119 to Indian Provisional Patent Application No. 201741040880 filed on Nov. 15, 2017, and Indian Patent Application No. 201741040880 filed on Nov. 14, 2018, the disclosures of which are incorporated by reference herein in their entireties.

TECHNICAL FIELD

Exemplary embodiments of the present invention relate to a static random-access memory (SRAM), and more particularly, to an SRAM having virtual banking architecture and a system and method including the same.

DISCUSSION OF THE RELATED ART

Static random-access memory (SRAM) is a widely used semiconductor device used for storing data. Performance of an SRAM largely depends on a power consumption factor associated with the SRAM.

Power consumption in the SRAM is affected through a bit line charging and a bit line discharging. An input/output (IO) circuit in the SRAM typically includes a pre-charge module, bit line drivers, sense amplifier, column select circuit, and bank select circuit. Each circuit within the IO module occupies a separate space. Furthermore, for each bit line array, an individual IO module is needed, as circuits of the IO module cannot be shared between multiple bit cell arrays. Thus, the IO circuit of the SRAM causes a high area penalty (e.g., requires a relatively large amount of space in the SRAM) and increases an overall cost of the SRAM.

In conventional approaches, power consumption of an SRAM may be reduced by increasing the number of banks. In such conventional approaches, banking may be done by duplicating a local input/output (IO) block. For example, to build a 4-Bank SRAM, local IO may be repeated twice. Since the local IO performs a plurality of logic operations, duplication or repetition of the IO blocks may cause a drastic increase in the overall cost of an SRAM.

SUMMARY

According to an exemplary embodiment, a static random-access memory (SRAM) system using a virtual banking architecture includes a processor communicatively coupled to an SRAM and a plurality of circuits disposed in the SRAM and operated under control of the processor. The plurality of circuits includes a divide circuit, a select circuit disposed in the divide circuit, and a local input/output (IO) circuit connected to the select circuit. The divide circuit is configured to divide at least one bank into at least a first bit cell array and a second bit cell array, in which at least one of the first bit cell array and the second bit cell array includes at least one bit line. The select circuit is connected between the first bit cell array and the second bit cell array, and the select circuit selects one of the first bit cell array and the second bit cell array according to a predefined select logic. The local input/output (IO) circuit is connected to the select circuit, and generates an output according to one or more predefined operations of the local IO circuit.

According to an exemplary embodiment, a method of providing a virtual banking architecture in an SRAM includes dividing at least one bank into a first bit cell array and a second bit cell array, in which at least one of the first bit cell array and the second bit cell array includes at least one bit line. The method further includes connecting a divide circuit including a select circuit between the first bit cell array and the second bit cell array, in which the select circuit selects one of the first bit cell array and the second bit cell array according to a predefined select logic. The method further includes connecting a local input/output (IO) circuit to the select circuit, in which the local IO circuit generates an output according to one or more predefined operations of the local IO circuit.

According to an exemplary embodiment, an SRAM includes a first bank including a first bit cell array and a second bit cell array, a second bank including a third bit cell array and a fourth bit cell array, and a first divide circuit including a first select circuit. The first divide circuit is connected between the first bit cell array and the second bit cell array. The SRAM further includes a second divide circuit including a second select circuit. The second divide circuit is connected between the third bit cell array and the fourth bit cell array. The first select circuit selects one of the first bit cell array or the second bit cell array according to a predefined logic, and the second select circuit selects one of the third bit cell array or the fourth bit cell array according to the predefined select logic. The SRAM further includes a local input/output (IO) circuit connected between the first bank and the second bank. The local IO circuit generates an output of the SRAM. The output includes one of a generation of an output based on a state of global bit lines during a read operation, placing of data onto the global bit lines during a write operation, or pre-charging a bit line to a predetermined voltage level before initiating a new operation.

According to an exemplary embodiment, a method of executing one or more predefined operations in an SRAM include receiving, in the SRAM, an input for performing the one or more predefined operations in the SRAM, and selecting, by a select circuit disposed in the SRAM, a bit cell array from a plurality of bit cell arrays. Selecting the bit cell array is performed in accordance with a predefined select logic. The method further includes performing, by a local input/output (IO) circuit, the one or more predefined operations in accordance with the selecting.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF THE EXEMPLARY EMBODIMENTS

Exemplary embodiments of the present invention will be described more fully hereinafter with reference to the accompanying drawings. Like reference numerals may refer to like elements throughout the accompanying drawings.

It will be understood that descriptions of features or aspects within each exemplary embodiment should typically be considered as available for other similar features or aspects in other exemplary embodiments, unless the context clearly indicates otherwise. Further, the exemplary embodiments described herein may be embodied as separate exemplary embodiments or combined exemplary embodiments.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

Exemplary embodiments of the present invention provide a static random-access memory (SRAM) with a virtual banking architecture. Exemplary embodiments may reduce dynamic power consumption by splitting a bit cell array into multiple banks in an SRAM. Exemplary embodiments may further reduce system cost for high speed memory, and may provide a select circuit connected between multiple banks.

Accordingly, exemplary embodiments herein provide an SRAM that may reduce dynamic power consumption and may reduce the area and cost of the SRAM, as well as a system and method including the same. The proposed SRAM system, method, and SRAM according to exemplary embodiments include splitting a bit line array into one half array or quarter array in multi-banks of the SRAM. Further, exemplary embodiments include placing a select circuit between every two banks of the SRAM.

An SRAM system (also referred to hereinafter as a system) according to exemplary embodiments may be implemented as a processing system, and may be implemented in a variety of computing systems such as, for example, a laptop computer, a desktop computer, a notebook, a workstation, a mainframe computer, a server, a network server, etc. It will be understood that the system may be accessed by multiple users through one or more user devices, or by applications residing on the user devices. Examples of the user devices may include, but are not limited to, a portable computer, a personal digital assistant, a handheld device, and a workstation. The user devices may be communicatively coupled to the proposed system through a network.

The proposed system may include at least one processor, an input/output (I/O) interface, and a memory. The at least one processor may be implemented as one or more microprocessors, microcomputers, microcontrollers, digital signal processors, central processing units, state machines, logic circuitries, and/or any devices that manipulate signals based on operational instructions. Among other capabilities, the at least one processor is configured to fetch and execute computer-readable instructions stored in the memory.

The I/O interface may include a variety of software and hardware interfaces such as, for example, a web interface, a graphical user interface, etc. The I/O interface may allow the system to interact with a user directly or through the client devices. Further, the I/O interface may enable the system to communicate with other computing devices, such as web servers and external data servers. The I/O interface can facilitate multiple communications within a wide variety of networks and protocol types, including wired networks such as, for example, LAN, cable, etc., and wireless networks such as, for example, WLAN, cellular, or satellite. The I/O interface may include one or more ports for connecting a number of devices to one another or to another server.

The memory may include any computer-readable medium such as, for example, volatile memory such as static random-access memory (SRAM) and dynamic random-access memory (DRAM), and/or non-volatile memory such as read only memory (ROM), erasable programmable ROM, flash memories, hard disks, optical disks, and magnetic tapes. The memory may include modules and data. Herein, the terms "module" and "circuit" may be used interchangeably.

The modules include routines, programs, objects, components, data structures, etc., which perform particular tasks or implement particular data types. The modules may include programs or coded instructions that supplement applications and functions of the system.

The data serves as a repository for storing data processed, received, and generated by one or more of the modules. The data may include data generated as a result of the execution of one or more modules.

Figure 1:
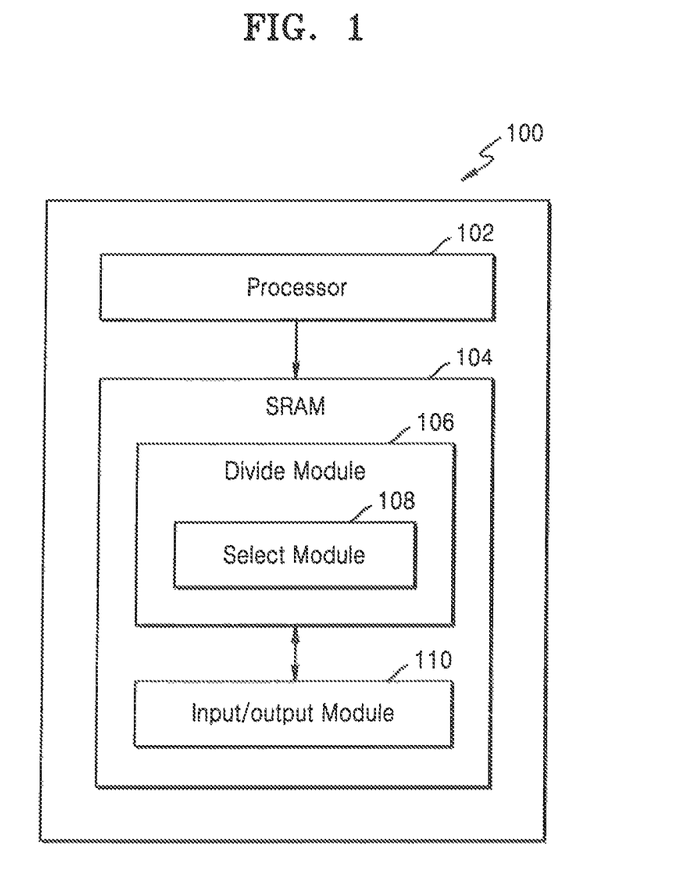
FIG. 1 illustrates a static random-access memory (SRAM) system that implements a virtual banking architecture in an SRAM, according to an exemplary embodiment.

FIG. 1 illustrates an SRAM system that implements a virtual banking architecture in an SRAM, according to an exemplary embodiment.

Referring to FIG. 1, in an exemplary embodiment, an SRAM system 100 using a virtual banking architecture is implemented. The SRAM system 100 includes a processor 102 coupled to an SRAM 104. The SRAM 104 includes a plurality of modules to be executed by the processor 102. For example, the plurality of modules is operated under the control of the processor 102. The plurality of modules includes a divide module 106 configured to divide a bank into a plurality of bit cell arrays (e.g., two or more bit cell arrays). The divide module 106 includes one or more select modules 108 connected between the plurality of bit cell arrays. The select modules 108 select one bit cell array from the plurality of bit cell arrays. The plurality of modules further includes a local input/output (IO) module 110 that generates an output according to one or more predefined operations of the local IO module 110.

In an exemplary embodiment, the SRAM system 100 may include one of a controller functioning as the processor 102 and that controls the plurality of modules or an application processor. Examples of the SRAM system 100 include any system that utilizes the SRAM 104 such as, for example, a television set or a wireless communication system.

Figure 2:
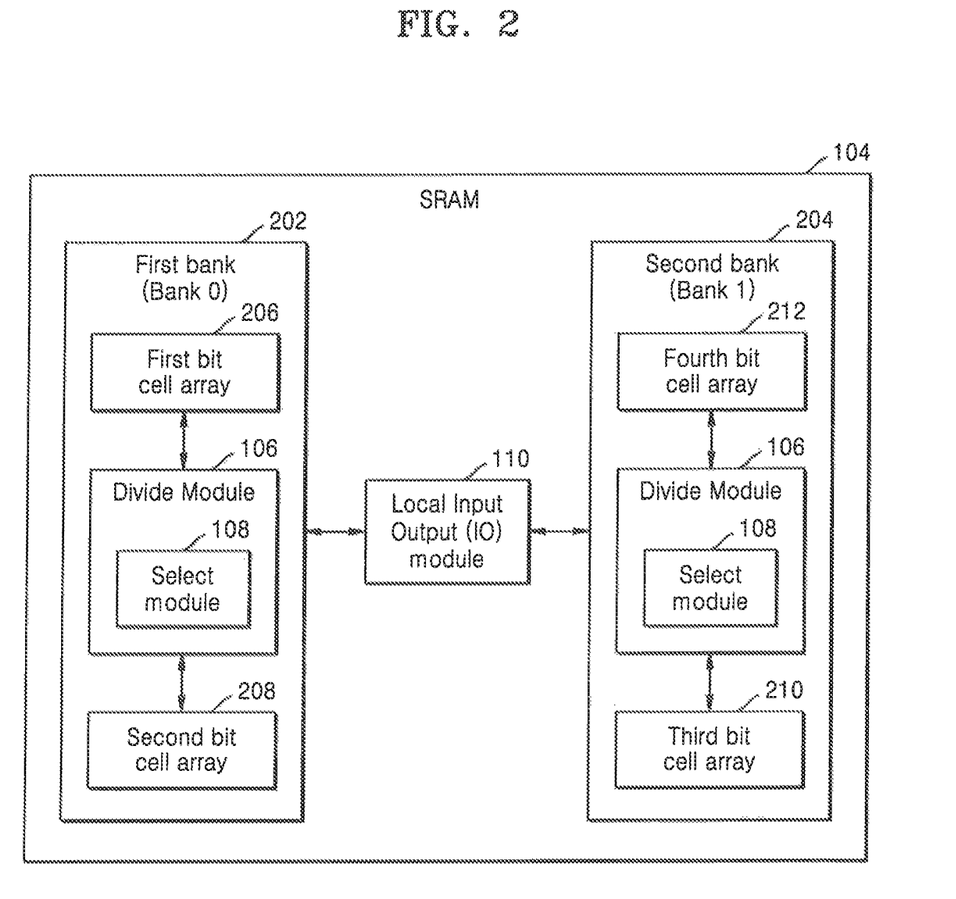
FIG. 2 illustrates a configuration of an SRAM with a divide module disposed between two or more bit cell arrays of each of a first bank and a second bank, according to an exemplary embodiment.

FIG. 2 illustrates a configuration of an SRAM with a divide module disposed between two or more bit cell arrays of each of a first bank and a second bank, according to an exemplary embodiment.

Referring to FIG. 2, an exemplary configuration of the SRAM 104 is shown. The SRAM 104 may be configured in the form of a chip. The SRAM 104 may include multiple banks in a bit cell array. The bit cell array includes at least one bit line.

The bit line represents each of global bit lines and local bit lines. Each of the global bit lines and the local bit lines is part of each of the at least one bank and each bit cell array of the plurality of bit cell arrays.

As shown in FIG. 2, the SRAM 104 includes a first bank 202 (bank 0) and a second bank 204 (bank 1). The SRAM 104 further includes a local IO module 110 connected to each of the first bank 202 (bank 0) and the second bank 204 (bank 1). The first bank 202 includes a first bit cell array 206 (bit cell array 0) and a second bit cell array 208 (bit cell array 1). The second bank 204 includes a third bit cell array 210 (bit cell array 2) and a fourth bit cell array 212 (bit cell array 3).

The SRAM 104 in the exemplary embodiment of FIG. 2 enables sharing of the local IO module 110 between the two or more bit cell arrays of the first bank 202 and the second bank 204.

Although the exemplary embodiment of FIG. 2 illustrates two banks, the present invention is not limited thereto. For example, in an exemplary embodiment, the SRAM 104 may include more than two banks. Each of the more than two banks may be converted into at least two bit cell arrays.

The local IO module 110 generates an output according to one or more predefined operations of the local IO module 110. The one or more predefined operations of the local IO module 110 includes at least one of a read operation, a write operation, and a pre-charge operation. The local IO module 110 will be discussed in further detail below with reference to FIG. 3.

The divide module 106 is disposed between the first bit cell array 206 and the second bit cell array 208 in the first bank 202, and the divide module 106 is disposed between the third bit cell array 210 and the fourth bit cell array 212 in the second bank 204. The divide module 106 is a new cell connected to each of the first bit cell array 206 and the second bit cell array 208, and the third bit cell array 210 and the fourth bit cell array 212, through global bit lines.

The divide module 106 includes one or more select modules 108. The collective presence of the one or more select modules 108 in the SRAM 104 is termed as the divide module 106. For example, the one or more select modules 108 form the divide module 106. The divide module 106 divides the first bank 202 into the first bit cell array 206 and the second bit cell array 208, and divides the second bank 204 into the third bit cell array 210 and the fourth bit cell array 212, based on division of bit lines in each of the first bank 202 and the bank 204.

Referring to the divide module 106, the size of the bit line in each of the first bank 202 and the second bank 204 is reduced to a predefined fraction. In an example, the predefined fraction is one half the size of the bit line, or one fourth the size of the bit line. With division of the bit line by the divide module 106, predefined value of capacitance associated with the bit line of each of the first bank and the second bank is also reduced, thereby saving dynamic power.

The one or more select modules 108 in the divide module 106 are configured to select one of the first bank 202 or the second bank 204 based on a predefined select logic circuit. The predefined select logic circuit may include, for example, a column select logic circuit. The column select logic circuit includes each of the read column select logic, write column select logic, and bit cell array select logic. Based on each of a column address, address of the bit cell array, and a signal that enables one of the read operation or the write enable operation, the select module 108 selects one bit line of multiple bit lines from one of the first bit cell array 206 and the second bit cell array 208, and connects the bit line to the global bit line.

The column select logic is applied by the select module 108 along with a bit cell address for connecting to the global bit lines. The selection is performed for executing one of a read operation in the SRAM 104 or a write operation in the SRAM 104.

Figure 3:
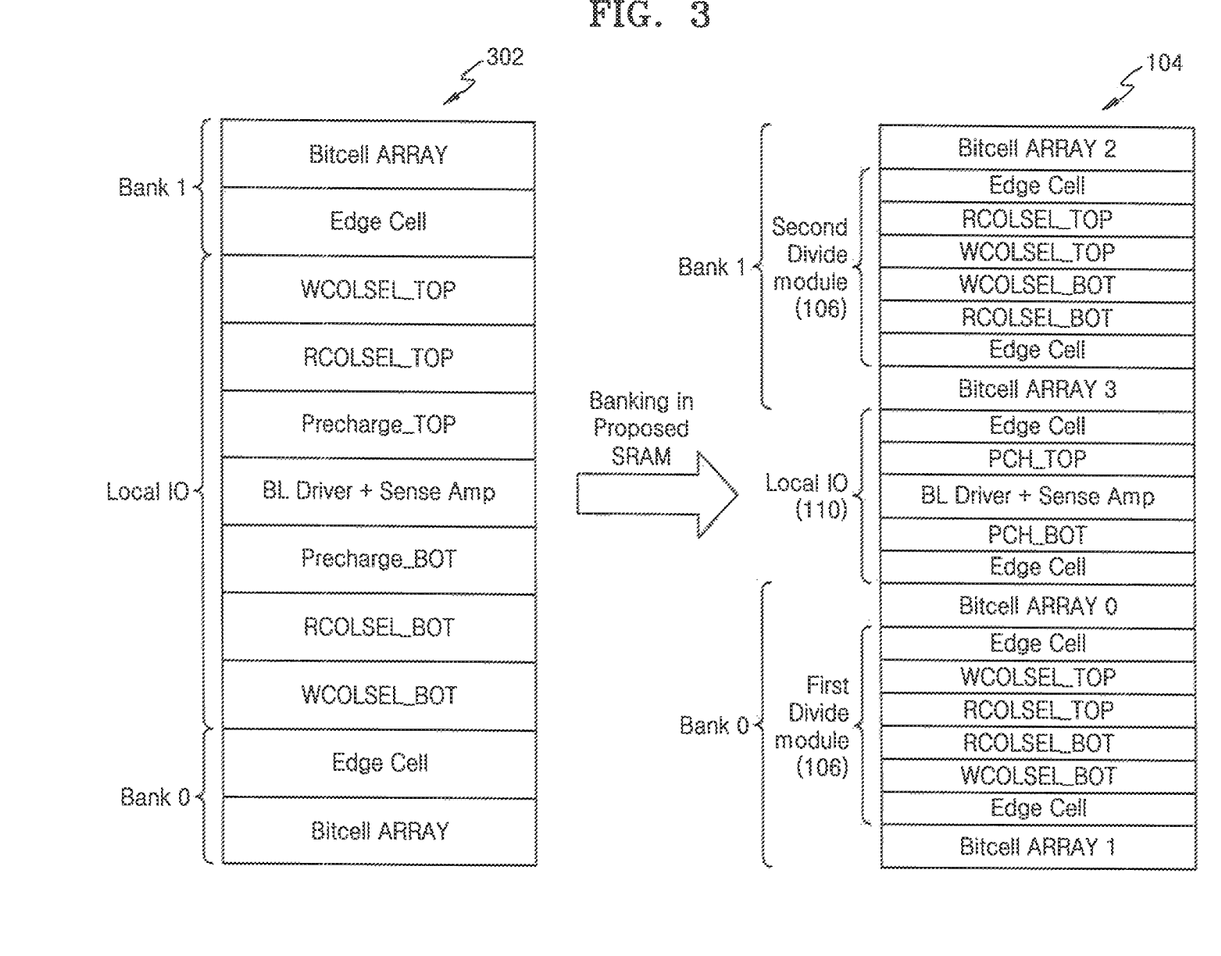
FIG. 3 illustrates an SRAM with multi-bank architecture, in which the SRAM includes a local input/output (IO) circuit and a divide module including a select module, according to an exemplary embodiment.

FIG. 3 illustrates an SRAM with multi-bank architecture, in which the SRAM includes a local IO circuit and a divide module including a select module, according to an exemplary embodiment.

Referring to FIG. 3, in an exemplary embodiment, the SRAM 104 including the local IO module 110 connected between two banks (e.g., Bank 0 and Bank 1) of the multiple banks is shown. As discussed with reference to FIG. 2, the divide module 106 refers to a collection of one or more select modules 108. FIG. 3 shows an SRAM 302 with the local IO 110 connected to each of a first bank (Bank 0) and a second bank (Bank 1). The SRAM 302 is transformed into the SRAM 104 by implementing the first divide module 106 in the first bank (Bank 0) and a second divide module 106 in the second bank (Bank 1). The first bank (Bank 0) includes a bit cell array 0, a bit cell array 1, and two edge cells. The second bank (Bank 1) includes a bit cell array 2 and a bit cell array 3 along with two edge cells.

Each of the first divide module 106 and the second divide module 106 stores one or more select modules 108. In FIG. 3, the SRAM 104 is designed by the implementation of the divide module 106 between each bank of the multiple banks, thereby avoiding a repetition of the local IO module 110. Therefore, according to exemplary embodiments, implementation of the divide module 106 saves cost, area and power. Each of the select modules 108 in the divide module 106 is further described with reference to FIG. 4.

The local IO module 110 shown in FIG. 3 includes one or more circuits. The one or more circuits may include, for example, bit line drivers, sense amplifiers, precharge logic, and bank select logic. The one or more circuits of the local IO module 110 are described in further detail with reference to FIG. 5.

The SRAM system 100 receives a user input regarding one of a read operation or a write operation as the predefined operation. Before initiating the predefined operation on the SRAM 104, the precharge logic (shown as PCH_TOP and PCH_BOT in FIG. 3) charges each of the global bit lines and local bit lines to a predefined voltage level.

As per the user input, the bit line drivers (BL drivers in FIG. 3) place data onto the global bit lines. The data is placed according to a selection of one of the first bank (Bank 0) or the second bank (Bank 1). The bank select logic includes, for example, a multiplexer configured to select one of the first bank (Bank 0) or the second bank (Bank 1) based on an address of the bank.

The sense amplifier referred to in FIG. 3 (Sense amp in FIG. 3) senses the data on global bit lines and translates the data to an output.

In an exemplary embodiment, the SRAM 302 shown in FIG. 3 is transformed into a 4-bank SRAM by using a single local IO module 110 and two divide modules 106 (a first divide module 106 in the first bank (Bank 0) and a second divide module 106 in the second bank (Bank 1)). For example, the 4-bank SRAM includes the first bank (Bank 0), which includes the bit cell array 0 and the bit cell array 1, and the second bank (Bank 1), which includes the bit cell array 2 and the bit cell array 3.

Figure 4:
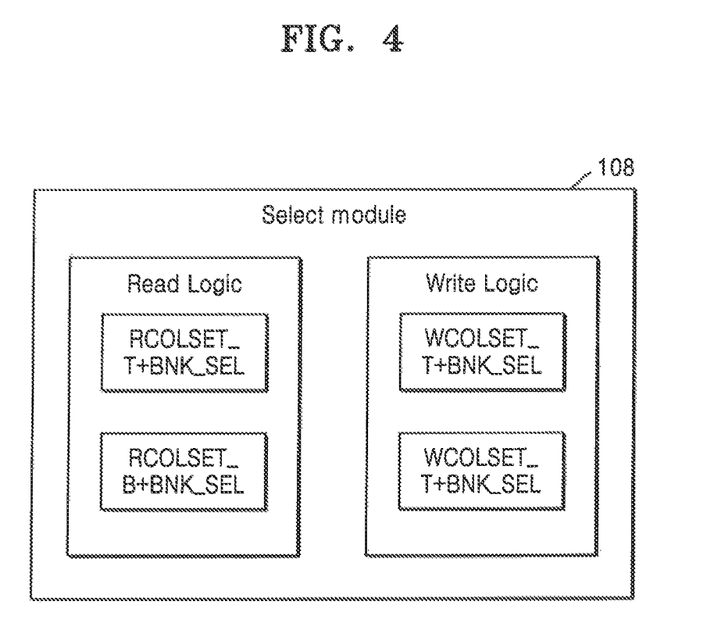
FIG. 4 illustrates a select module included in a divide module of an SRAM, according to an exemplary embodiment.

FIG. 4 illustrates a select module included in a divide module of an SRAM, according to an exemplary embodiment.

Referring to FIG. 4, in an exemplary embodiment, the select module 108 includes one or more select logics. The one or more select logics include a column select logic with a bank select logic. The select logic selects one bit cell array from the plurality of bit cell arrays for performing one of the read operation or the write operation as the predefined operation.

The column select logic includes a read column select logic from top (RCOLSEL_TOP) (see FIG. 3) for selecting one of a local bit line from a plurality of local bit lines from a top side bit cell array during a read operation in a hierarchy of bit lines, a write column select logic from top (WCOLSEL_TOP) (see FIG. 3) for selecting one of a local bit line from the plurality of local bit lines in the top side bit cell array during a write operation, a read column select logic from bottom (RCOLSEL_BOT) (see FIG. 3) for selecting one of a local bit line from a plurality of local bit lines in a bottom side bit cell array during a read operation, and a write column select logic from bottom (WCOLSEL_BOT) (see FIG. 3) for selecting one of a local bit line from the plurality of local bit lines from the bottom bit cell array during a write operation.

Based on the bank address, the bank select logic selects for access one of the banks (Bank 0 or Bank 1) for performing the read operation as the predefined operation or one of the banks (Bank 0 or Bank 1) for performing the write operation as the predefined operation. The one or more select logics are used to perform one of the read operation or the write operation in the SRAM 104. Each of the read operation and the write operation is selected by a user and is performed by the one or more circuits of the local IO module 110.

Figure 5:
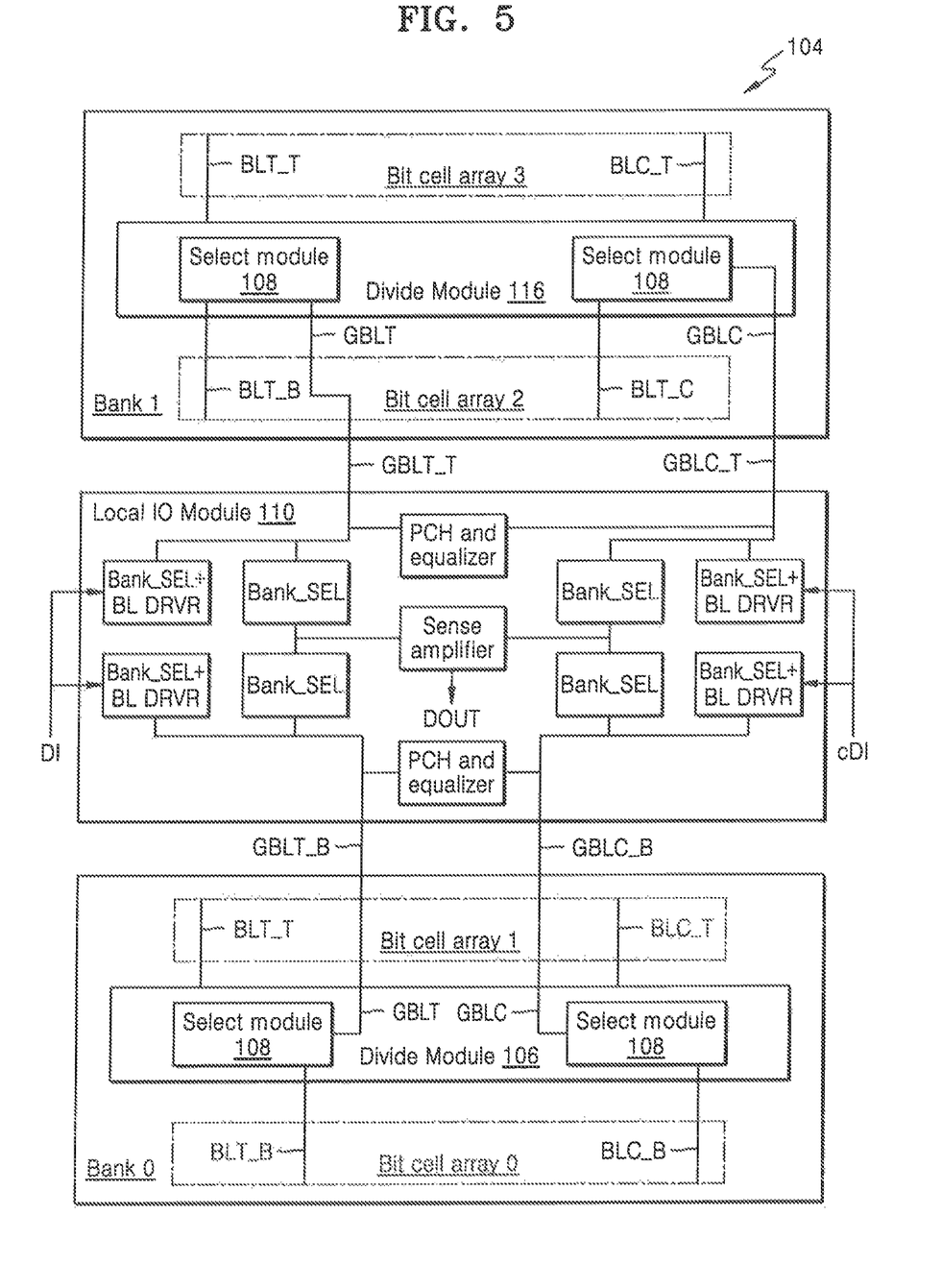
FIG. 5 illustrates an SRAM including hierarchical bit lines, according to an exemplary embodiment.

FIG. 5 shows the SRAM 104 with hierarchical bit lines and global lines, according to an exemplary embodiment. Local bit lines (shown as BLT_T, BLC_T, BLT_B, and BLC_B) in the SRAM 104 are connected to each of the bit cell array 0, bit cell array 1, bit cell array 2, and the bit cell array 3 (top to bottom in FIG. 5).

Each of the first bank (Bank 0) and the second bank (Bank 1) includes the divide module 106. Each divide module 106 includes two select modules 108 that connect the local bit lines to the global bit lines, shown as each of GBLT_T and GBLC_T in Bank 1 and each of GBLT_B and GBLC_B in Bank 0, based on a column select logic. The local IO module 110 includes the bit line drivers and the sense amplifier (SA) circuits as described above.

Before initiation of one of the read operation or the write operation, the local bit lines and the global bit lines are charged to a predefined level by the pre-charge module (PCH and equalizer module) of the local IO module 110.

Still referring to FIG. 5, in an exemplary embodiment, if the user selects the write operation as the predefined operation, data comes from a data input (DI) and a complement of the 1-bit information goes to cDI. Complement of DI (cDI) is generated inside the SRAM 104. Local bit lines of each of the bit cell array 0, the bit cell array 1, the bit cell array 2, and the bit cell array 3, are connected to the global bit lines through the select module 108.

The bit line connects to the bank selection logic of the select module 108 and selects one of a top side bank (Bank 1) or a bottom side bank (Bank 0) for writing the data. If the select module 108 selects the bottom side bank (Bank 0), then the bit line driver of the local IO module 110 translates data onto the global bit line of the bottom side bank (Bank 0).

After the translation of the data, the global bit line connects to the select module 108. Since the operation is a write operation, the WCOLSEL operation (see FIG. 3) of the select module 108 translates the data to one or more of the bit lines connected to the bit cell array based on the selection of one of the bit cell array 0 or the bit cell array 1. One of the bit cell array 0 or the bit cell array 1 then receives the data from the global bit line and stores the received data in one of the bit cell array 0 or the bit cell array 1.

Data stored in one of the bit cell array 0 or the bit cell array 1 will be translated to local bit lines. From the local bit lines data will be translated to global bit lines based on RCOLSEL and bit cell array selection of the select module 108. The data on the global bit lines may then be sensed by the sense amplifier of the local IO module 110 and then transmitted to the output of the SRAM 104.

The data from one of the first bank (Bank 0) or the second bank (Bank 1) is then passed to the sense amplifier. The sense amplifier senses and translates the data into an output of the SRAM 104.

FIG. 5 further illustrates sharing of the single local IO module 110 between each of the bit cell array 0, bit cell array 1, bit cell array 2, and bit cell array 3. The predefined select logic of the select module 108 enables the sharing based on the predefined select logic. The predefined select logic selects one bit line from the multiple bit lines in one of the bit cell arrays, and the local IO module 110 executes the predefined operation on the bit line selected by the select module 108.

The SRAM system 100 and the SRAM 104 provide improvements associated with the virtual bank architecture compared to a conventional SRAM system and a conventional SRAM. For example, the SRAM system 100 and the SRAM 104 may provide dynamic power savings in the range of about 5% to about 15% based on a single port SRAM design in 10 nm technology, as shown in Table 1 below. Further, the virtual banking architecture of the SRAM 104 helps in achieving low power system with minimal impact to system cost and system performance.

| Instance | Reduction in Dynamic power | Area Penalty |
| --- | --- | --- |
| ln10lpp_mc_ra1_hs_lvt_4096×80m8b2c1 | 15.80% | 7% |
| ln10lpp_mc_ra1_hs_lvt_2048×80m8b2c1 | 15.30% | 12% |
| ln10lpp_mc_ra1_hs_lvt_1024×80m8b2c1 | 14.10% | 18% |

Table 1

Figure 6:
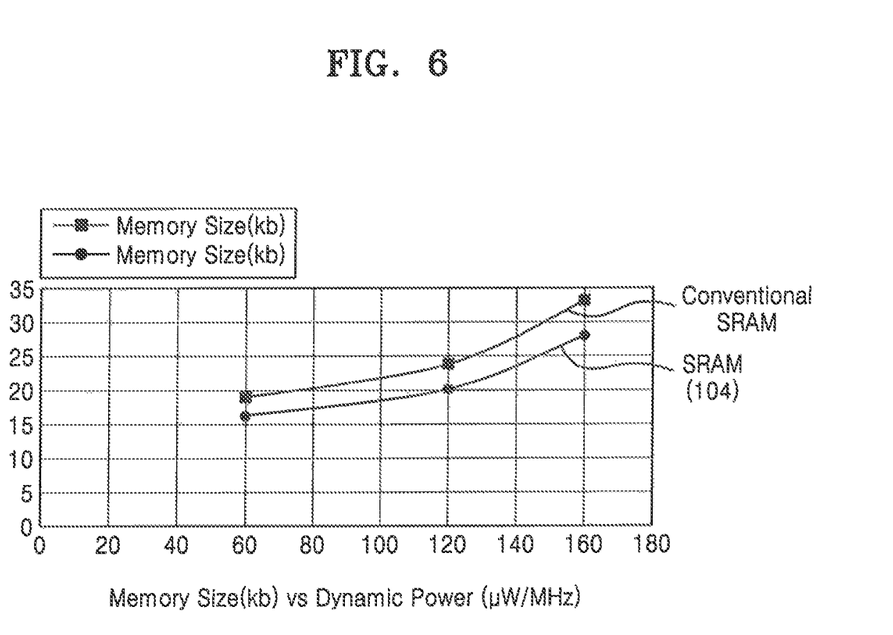
FIG. 6 shows a graphical illustration of memory size vs. dynamic power consumption for a conventional SRAM and an SRAM according to an exemplary embodiment.

FIG. 6 shows a graphical illustration of memory size (in Kb) (on x-axis) relative to dynamic power (in μW/MHz) (on y-axis) for a conventional SRAM and the SRAM 104 according to an exemplary embodiment. As shown in FIG. 6, less power is consumed by the SRAM 104 as compared to the conventional SRAM.

Figure 7:
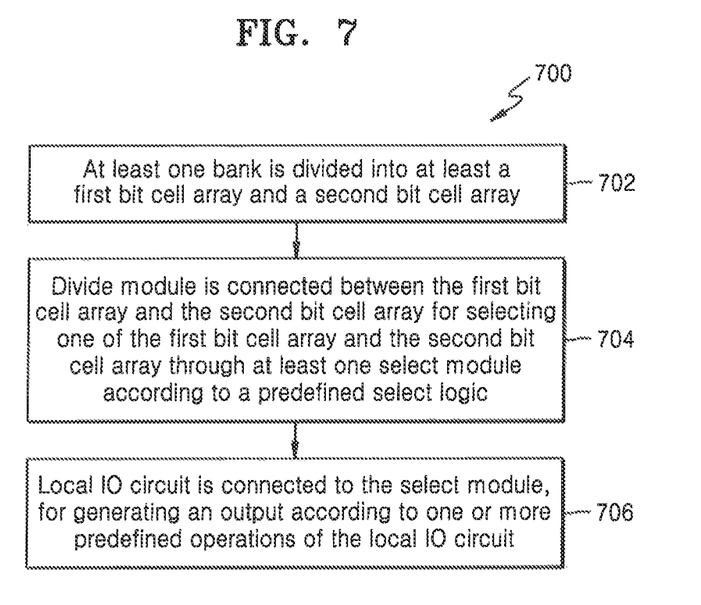
FIG. 7 illustrates a method of providing a virtual banking architecture in an SRAM, according to an exemplary embodiment.

FIG. 7 illustrates a method 700 of providing a virtual banking architecture in an SRAM, according to an exemplary embodiment.

Referring to FIG. 7, the illustrated method 700 is used to design the SRAM 104. The method 700 includes dividing the at least one bank into at least two bit cells (block 702). For example, referring to FIG. 2, the first bank 202 (Bank 0)

is divided into the first bit cell array 206 and the second bit cell array 208, and the second bank 204 (Bank) is divided into the third bit cell array 210 and the fourth bit cell array 212. Each at least one bit cell array includes at least one bit line.

At block 704, the at least one divide module 106 is connected between the two divided bit cells (e.g., referring to FIG. 2, the first bit cell array 206 and the second bit cell array 208 in the first bank 202 (Bank 0), and the third bit cell array 210 and the fourth bit cell array 212 in the second bank 204 (Bank 1)). The at least one divide module 106, through the select module 108, selects one of the two divided bit cell arrays according to the bit cell array address provided by a user.

At block 706, the local IO module 110 is connected to the at least one select module 108. The local IO module 110 generates an output according to one or more predefined operations of the local IO module 110.

Figure 8:
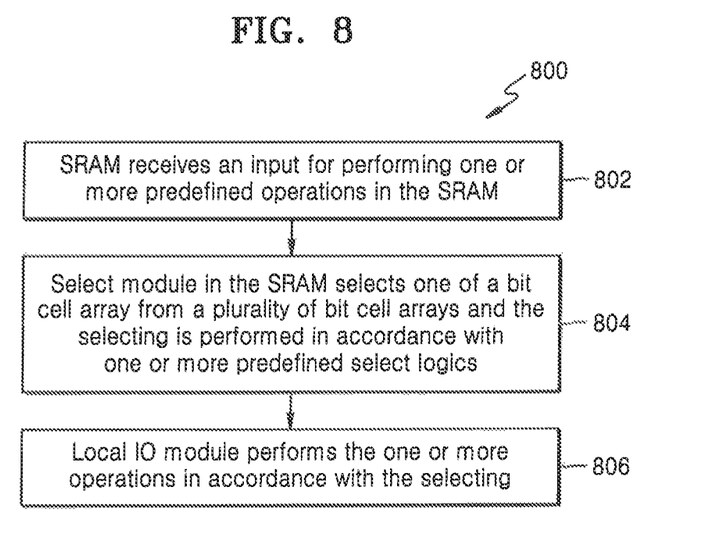
FIG. 8 illustrates a method of executing one or more predefined operations in an SRAM, according to an exemplary embodiment.

FIG. 8 illustrates a method 800 of executing one or more predefined operations in an SRAM, according to an exemplary embodiment. The SRAM may be, for example, the SRAM 104.

At block 802, the SRAM 104 receives an input for performing one or more predefined operations in the SRAM 104.

At block 804, the select module 108 in the SRAM 104 selects one bit cell array from the plurality of bit cell arrays. The selecting is performed in accordance with one or more select logics.

At block 806, the local IO module 110, performs the one or more operations in accordance with the selecting.

The methods 700 and 800 may be implemented with the SRAM system 100 and the SRAM 104. Thus, for convenience of explanation, a further description of elements and processes previously described is omitted herein.

The exemplary embodiments disclosed herein can be implemented using at least one software program running on at least one hardware device and are used to control the elements of the exemplary embodiments.

As is traditional in the field of the present invention, exemplary embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Herein, the term "circuit" may refer to an analog circuit or a digital circuit. In the case of a digital circuit, the digital circuit may be hard-wired to perform the corresponding tasks of the circuit, such as a digital processor that executes instructions to perform the corresponding tasks of the circuit. Examples of such a processor include an application-specific integrated circuit (ASIC) and a field-programmable gate array (FPGA).

While the present invention has been particularly shown and described with reference to the exemplary embodiments thereof, it will be understood by those of ordinary skill in the art that various changes in form and detail may be made therein without departing from the spirit and scope of the present invention as defined by the following claims

What is claimed is:

1. A static random-access memory (SRAM) system using a virtual banking architecture, the SRAM system comprising:
   a processor communicatively coupled to an SRAM; and
   a plurality of circuits disposed in the SRAM and operated under control of the processor, the plurality of circuits comprising:
   a divide circuit configured to divide at least one bank into at least a first bit cell array and a second bit cell array, wherein at least one of the first bit cell array and the second bit cell array comprises at least one bit line;
   a select circuit disposed in the divide circuit, wherein the select circuit is connected between the first bit cell array and the second bit cell array, and the select circuit selects one of the first bit cell array and the second bit cell array according to a predefined select logic; and
   a local input/output (IO) circuit connected to the select circuit, wherein the local IO circuit generates an output according to one or more predefined operations of the local IO circuit.

2. The SRAM system as claimed in claim 1, wherein the select circuit connects the at least one bit line to a global bit line based on the predefined select logic.

3. The SRAM system as claimed in claim 1, wherein the predefined select logic comprises a column select logic.

4. The SRAM system as claimed in claim 1, wherein the one or more predefined operations of the local IO circuit comprises at least one of a read operation, a write operation, or a pre-charge operation.

5. The SRAM system as claimed in claim 4, wherein the output generated by the local IO circuit comprises one of a generation of an output based on a state of global bit lines during the read operation, placing of data onto the global bit lines during the write operation, or pre-charging the at least one bit line to a predetermined voltage level before initiating a new operation of the one or more predefined operations.

6. The SRAM system as claimed in claim 5, wherein the at least one bit line represents each of the global bit lines and local bit lines, and each of the global bit lines and the local bit lines are part of each of the at least one bank and each of the first and second bit cell arrays.

7. The SRAM system as claimed in claim 1, wherein the select circuit connects the at least one bit line in one of the first bit cell array and the second bit cell array to a global bit line.

* * * * *